United States Patent [19]

Peil et al.

[11] 4,453,094
[45] Jun. 5, 1984

[54] THRESHOLD AMPLIFIER FOR IC FABRICATION USING CMOS TECHNOLOGY

[75] Inventors: William Peil, North Syracuse; Thomas A. Brown, Fulton; Marc A. Dissosway, Liverpool, all of N.Y.

[73] Assignee: General Electric Company, Schenectady, N.Y.

[21] Appl. No.: 393,696

[22] Filed: Jun. 30, 1982

[51] Int. Cl.$^3$ ............... H03K 19/003; H03K 17/04; H03K 19/017; G11C 27/00

[52] U.S. Cl. ............... 307/451; 307/500; 307/501; 307/579; 307/585; 307/270; 307/297; 323/315; 330/288

[58] Field of Search ............ 307/451, 469, 496, 497, 307/499, 500, 501, 530, 351, 576, 579, 585, 270, 297, 464, 475; 330/257, 288; 323/312, 313, 315, 316, 317

[56] References Cited

U.S. PATENT DOCUMENTS

| | | | |
|---|---|---|---|
| 3,702,943 | 11/1972 | Heuner et al. | 307/576 X |
| 4,264,874 | 4/1981 | Young | 307/451 X |
| 4,300,091 | 11/1981 | Schade, Jr. | 307/297 X |
| 4,302,690 | 11/1981 | Gollinger et al. | 307/451 |
| 4,375,038 | 2/1983 | Crosby | 307/500 X |

Primary Examiner—Stanley D. Miller
Assistant Examiner—David R. Bertelson
Attorney, Agent, or Firm—John P. McMahon; Philip L. Schlamp; Richard V. Lang

[57] ABSTRACT

The present invention relates to a threshold amplifier suited to integrated circuit fabrication of a process employing CMOS technology. The threshold amplifier is designed to sense current producing a first or a second logic level as a function of a current threshold. The amplifier comprises a p-channel device and a n-channel device serially connected across the bias supply. The gate to source voltages of the two devices are respectively controlled by a diode connected p-channel device similarly serially connected across the bias supply with a diode connected n-channel device, the source of the latter being returned to ground via a current carrying resistance also in the second series path. The output level which is taken at the drain inter-connection between the devices in the first series path depends on the relative conductivity of the two devices which is in turn affected by the induced voltage drop in the source connected resistance in the second series path. The threshold voltage may be controlled by the geometry ratio between the n-channel devices, and the current setting in the second series path.

14 Claims, 7 Drawing Figures

LOWER RIGHT DEVICE - 4X

AVERAGE THRESHOLD VS RESISTANCE

FIG. 4
THRESHOLD ON VARIOUS CONFIGURATIONS
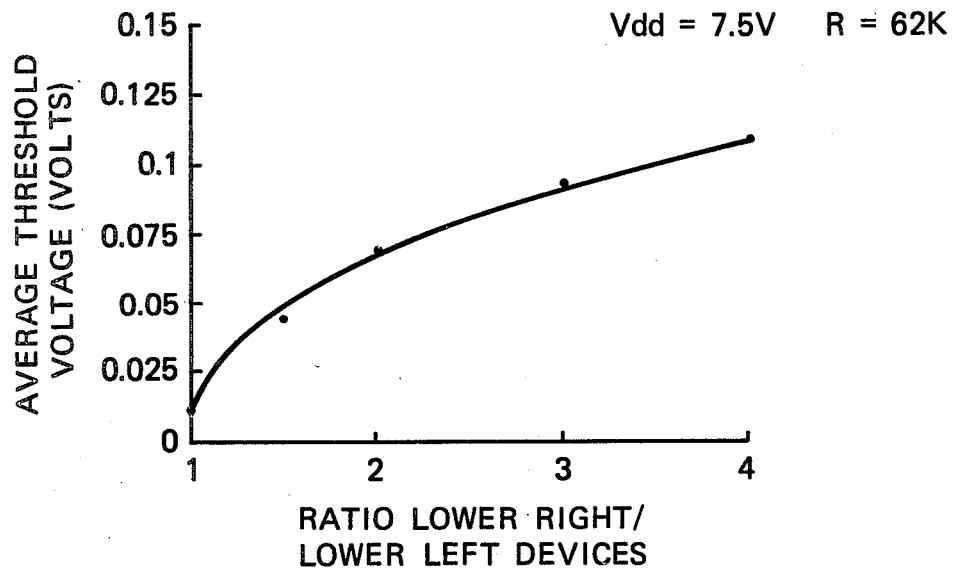
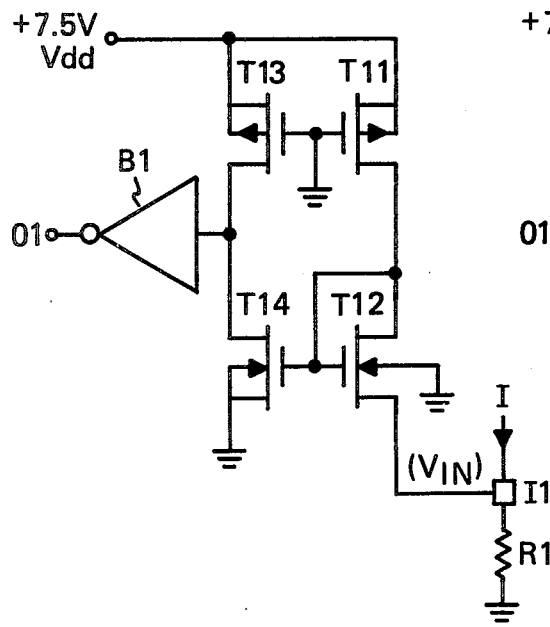
FIG. 6
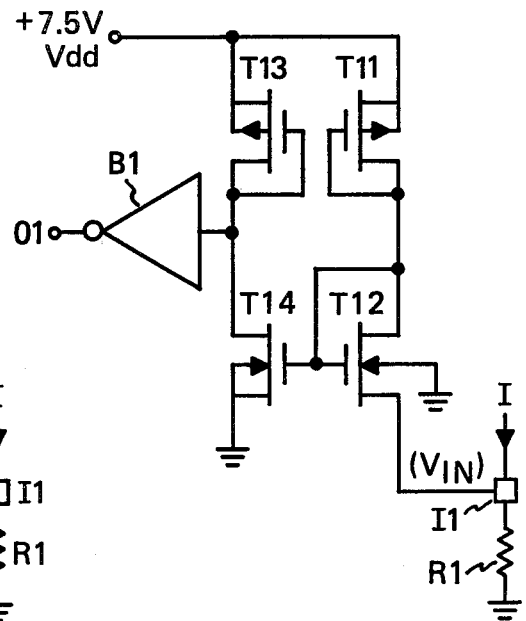
FIG. 7

THRESHOLD AMPLIFIER FOR IC FABRICATION USING CMOS TECHNOLOGY

BACKGROUND OF THE INVENTION

1. Field of the Invention

The present invention relates to threshold amplifiers and more particularly to threshold amplifiers suited to integrated circuit fabrication by a process employing complementary metal oxide semiconductor (CMOS) field effect transistor technology.

2. Description of the Prior Art

Integrated circuits have traditionally fallen into separate classes: those which operate in a digital fashion and those which operate in an analog fashion. The complementary metal oxide semiconductor field effect transistor process has traditionally been used for digital applications in which both the input signals and the output signals are digital. The present invention deals with the problem of creating an interface between analog data which may be obtained by sensors not a part of the integrated circuit and digital logic which is a part of the integrated circuit.

In this effort, it is essential that a means be provided for determining how to deal with analog data. Such means include the threshold amplifier which, in the ideal case produced either a "1" or a "0" in the output, while the input continuously varies through a threshold value.

The present threshold amplifier utilizes, as a circuit portion, a "mirror" that has as its counter part in analog circuitry, the bipolar current mirror. In the conventional bipolar current mirror, a diode connected transistor is provided in an energized current path, and it is connected across the input junction of an active bipolar transistor, whose operating point is to be stabilized. Base current flow in the bipolar transistor and temperature effects tend to reduce the stability of the operating point, and other circuit measures usually are adopted to compensate for these limitations of the circuit. The present invention employs the principle of the mirror in a field effect transistor configuration.

SUMMARY OF THE INVENTION

Accordingly, it is an object of the invention to provide an improved threshold amplifier for integrated circuit fabrication.

It is another object of the invention to provide an improved threshold amplifier for integrated circuit fabrication in which the threshold may be readily selected.

It is a further object of the invention to provide an improved threshold amplifier for integrated circuit fabrication using a complementory metal oxide semiconductor process.

These and other objects of the inventor are achieved in a novel threshold amplifier for integrated circuit fabrication. In the threshold amplifier, a first and a second terminal for connection to a bias supply are provided. The threshold amplifier comprises a first series circuit connected between the first and second supply terminals. This circuit comprises a diode connected first FET device having the source connected to the first supply terminal, with drain and gate interconnected; a diode connected second, FET device with drain and gate interconnected, the interconnection being conductively connected to the gate-drain connection of the first device, and a current sensing resistance connected between the source of the second device and the second supply terminal. In addition, means are provided to establish a desired current in the first series circuit.

A second series circuit is also provided connected between the first and second supply terminals. This circuit comprises a third, FET device having the source connected to the first supply terminal; and a fourth, FET device having the drain connected to the drain of the third device, the source of said fourth device being connected to the second supply terminal. The first and third devices are of the same polarity type, and the second and fourth devices are of the same polarity type, and complementary to the first and third devices.

The gates of the first and third devices are connected together to equalize the gate to source voltages of the devices, and the gate of the fourth device is connected to the gate-drain connection of the second device to equalize the gate to source voltage of the fourth device to the voltage between the gate of the second device and the second supply terminal.

An input terminal is provided for coupling a current to be sensed into the current sensing resistance. The voltage drop in the resistance attributable to the sensed current displaces the voltage of the source of the second device in relation to the voltage at the second supply terminal. In turn, the gate to source voltage of the fourth device is affected in a sense to keep the fourth device in a low conduction state in the absence of sensed current and in a high conduction state when the sensed current exceeds a given value, the third device being capable of conduction throughout.

Output means are provided, coupled to the drain connection of the third and fourth devices to provide a first digital output level when the sensed current is below the given value and a second digital output level, when the sensed current is above said given value.

The threshold amplifier may be carried out in two complementary configurations. In one, the first and second supply terminals are respectively the positive terminal and negative terminal of the supply; and the first and third FET devices are p-channel devices and the second and fourth FET devices are n-channel devices. In the other configuration, the first and second supply terminals are respectively the negative terminal and positive terminal of the supply; and the first and third FET devices are n-channel devices, and the second and fourth FET devices are p-channel devices.

In a fully integrated format, the means to establish a current in the first series circuit consists of a fifth FET device, conductively connecting the gate-drain of said first device to the gate-drain of the second device. The fifth device is selected to be of low conductivity relative to the first and second devices.

Where a non zero threshold is sought, the width of the gate region of the second device is varied from that of the fourth device to adjust the diode voltage drop therein in relation to the diode voltage drop of the first device, and in turn, to displace the value of sensed current at which the third device begins to conduct.

In a preferred form of the invention, in which the first and second supply terminals are respectively the positive terminal and negative terminal of said supply; and the first and third FET devices are p-channel devices, and the second and fourth FET devices are n-channel devices, the substrates of the first and third devices are connected to the positive terminal, and the substrates of the second and fourth devices are connected to said negative terminal.

The output means may include an inverting C-MOS buffer amplifier, or where more positive output states are desired, the output means may include an inverting buffer amplifier with hysteresis.

BRIEF DESCRIPTION DRAWINGS

The novel and distinctive features of the invention are set forth in the claims of the present application. The invention itself, however, together with further objects and advantages thereof, may best be understood by reference to the following description and accompanying drawings in which:

FIGS. 2, 3 and 4 are performance curves of a breadboarded version of a threshold amplifier; and FIGS. 5, 6 and 7 are electrical circuit diagrams of additional embodiments of the invention; FIG. 5 is applicable to slowly changing waveforms and uses a hysteresis output stage.

DESCRIPTION OF THE PREFERRED EMBODIMENTS

Figure 1:
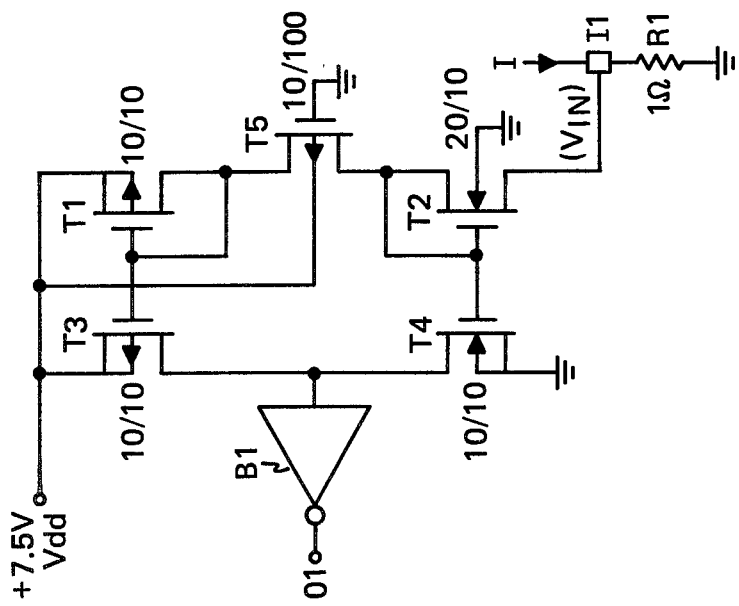
FIG. 1 is an electrical circuit diagram of a first embodiment of a threshold amplifier for integrated circuit fabrication, in a complementary metal oxide semiconductor field effect transistor process.

Referring now to FIG. 1, there is shown a novel threshold amplifier formed as an integrated circuit using a complementary metal oxide semiconductor (CMOS) field effect transistor process. The threshold amplifier is designed as an interface between analog data and devices requiring digital inputs. In this application, the threshold amplifier has a threshold, preferably having a steep slope so that few analog signals will fall on the slope and almost all analog signals will fall either above or below the slope, and thereby produce either a logical "low" or a logical "high" in the usual case. (The threshold amplifier, as is common with CMOS circuitry, provides an input to output inversion). If intermediate output values must be excluded, the threshold amplifier may also include a hysteresis gate in the output. The threshold amplifier includes at least four devices, a p-channel device (T1) and an n-channel device (T2) in a first series path and a p-channel device (T3) and a n-channel device (T4) in a second series path, thus lending itself to "CMOS" processing. As will be described, the gates of the p-channel devices and the gates of the n-channel devices are inter-connected to form FET counterparts of bipolar current mirrors.

The p-channel and n-channel devices are each illustrated by a long vertical line representing the channel and two short horizontal lines near the upper and lower ends of the 'channel' representing the source and drain electrodes. An arrow drawn between the electrodes, points away from the channel, when the device is a p-channel device (n-conductivity material in the channel) and into the channel when the device is an n-channel device (p-conductivity material in the channel). The short vertical line to the left of the channel represents the insulated gate and is the input or control electrode of the device.

In a p-channel device, both source and drain are small P+ diffusions in an n-doped substrate to which electrodes are applied. Since the source and drain may be reversed by reversing the bias connection, it is conventional to refer in a p-channel device to the most positively biased contact as the "source", while the less positively biased contact is referred to as the "drain". Conduction between source and drain arises by the inducement in the n material of a p-channel immediately under the insulating gate. Conduction occurs when the gate goes negative in respect to the source by an amount in excess of the device threshold, which allows conduction by the creation of majority carriers (positive holes) between the source and drain electrodes. This is called "en-hancement mode" operation.

The n-channel devices are formed in a larger P well which contains two electroded n+ regions, providing the source and drain respectively and spaced apart so that an insulated gate may be applied over the region between the two diffusions. As in the case of the p-channel device, the source and drain electrodes of an n-channel device may also be reversed. The source electrode is defined as the most negatively biased and the drain as the less negatively biased electrode. The n-channel device is turned on by the application of a positive potential to the gate which induces majority charges (electrons) in the n-channel. Conduction occurs when the positive potential applied to the gate, measured in respect to the source, exceeds the device threshold.

In the "CMOS" threshold amplifier illustrated in FIG. 1, the amplifier is designed to sense a current I applied between input terminal I1 and ground, and produce a low output if the current is below a threshold, and a high output if the current is above a threshold at the output 01 of an output buffer B1.

The threshold amplifier has the following circuit configuration. The amplifier is energized by a 7.5 volt, VDD supply, the negative terminal of the VDD supply being returned to a common ground connection. The threshold amplifier includes a first series circuit, connected between the positive supply terminal and the common terminal, which includes the previously identified T1 and T2 devices, as well as certain other circuit elements. The threshold amplifier includes a second series circuit connected between the positive terminal and the common terminal, which includes the previously identified T3 and T4 devices.

Continuing with the circuit description of the threshold amplifier; the p-channel device T1 is diode connected. The source and substrate of T1 are connected to the positive VDD terminal while the drain and the gate of T1 are connected together. A fifth device T5, a p-channel device, is provided having its source connected to the gate-drain of T1. The device T5 is a long channel device, which acts as a series resistance for standardizing the current in the first series path. The gate of T5 is connected to ground and the drain is coupled to the drain of device T2. Transistor T2 is a diode connected n-channel device, having the gate and the drain interconnected, the substrate grounded and the source connected, via the terminal I1, to one terminal of external resistance R1. The other terminal of resistance R1 is connected to ground.

The threshold amplifier circuit is completed by the elements in the second series path, the gate interconnections between devices in the first and second series paths, and the output buffer B1. The source and substrate of the p-channel device T3 are connected to the positive Vdd terminal, while the drain of T3 is connected to the drain of n-channel device T4. The source and substrate of T4 are connected to ground. The gate of device T3 is connected to the gate-drain of diode connected device T1 in a first current mirroring connection. The gate of device T4 is connected to the gate-drain of diode connected device T2 in a second current mirroring connection. The output of the threshold amplifier is derived from the drains of devices T3 and T4, and coupled via an inverting buffer B1, typically a CMOS stage, to the output 01.

Figure 2:
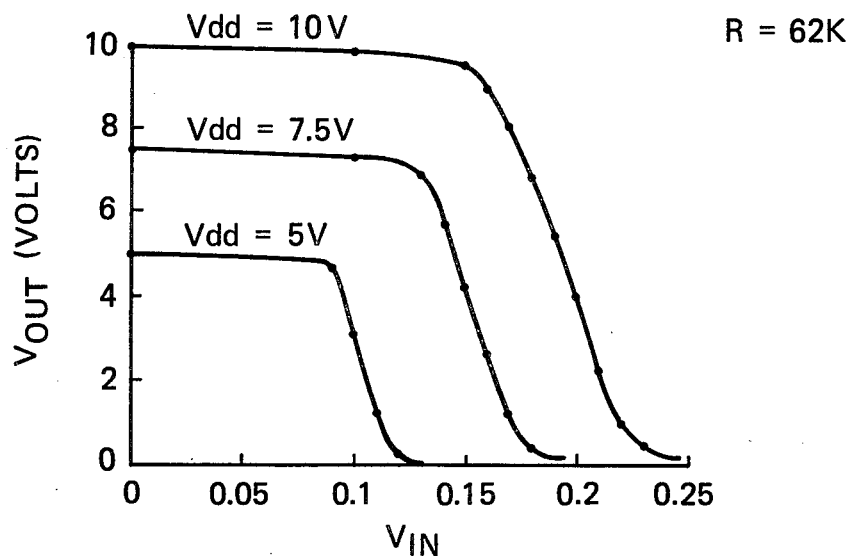

The threshold amplifier so far described has the transfer characteristic (the input to output voltage) illustrated in FIG. 2, assuming the following geometry. Devices T1, T3 and T4 have unit areas and like width to length ratios (10/10), while device T2 has four unit areas and like width to length ratios (10/10).

The transfer characteristic is defined as the voltage appearing at the buffer input as a function of the input voltage Vin. The input voltage is in turn defined as the voltage drop developed across R1, as a result of the external current introduced at I1. Typically the current in R1 attributable to the first series path is several tens of microamperes (e.g., 30) and that attributable to the external current is in tens of milliamperes. Under the circumstances, the drop in R1 is essentially attributable to the external current alone, and since R1 is a fixed 1 ohm resistance, the output characteristic may be regarded as also stating the output voltage as a function of the input current. Assuming a Vdd supply in FIG. 2 of 5 volts, the output voltage is slightly (less than 0.1 V) under 5 volts at a zero input voltage (current). As the input voltage increases to 0.09 volts, the output voltage reaches a first, concave downward, knee of the transfer characteristic. At 0.13 volts the other, concave upward, knee occurs, after which the output voltage is essentially zero volts. The region between 0.09 and 0.13 is that in which the transfer characteristic has the greatest slope and the center of the slope occurs at about 0.11 volts. The threshold region in an ideal threshold amplifier, has sharply defined knees and a nearly perpendicular slope. In practical cases however, the knees are more gradual and the slopes may vary from 20 to 200. In the case in question, the slope is approximately 125. Other configurations could go to 10,000.

The threshold amplifier may be characterized as including two similarly connected current mirrors (T3–T1; and T4–T2), connected into two series paths. The first series path consists of the diode connected transistor T1, connected to the positive terminal of the Vdd source; the high impedance transistor T5; the diode connected transistor T2, and the resistance R1 connected to the common terminal. The device geometry is designed to support a low current in the first series path. The current in the series path is set by the impedance of T5. T5 has a long channel, for low conductance, typically a length 10 times that of T1 and T2. T1 and T2 are in conduction, approximately one tenth nominal current at the current set primarily by T5. The drain of T1 is typically 1 to 1.5 volts below Vdd and the drain of T2 is typically 1 to 1.5 volts above the potential at R1. As earlier noted, the current in the series path may be on the order of tens of microamperes, and thus the voltage drop in the external R1 is negligible (assuming R1 is a low impedence).

The second series path includes the p-channel device T3, connected to the positive terminal of the Vdd source and the n-channel device T4 connected to the common terminal. The two p-channel devices T3, T1 form a first current mirror. Their sources are connected together, and the gate of T3 is connected to the gate-drain of T1 so as to equalize the gate to source voltage of device T3 to that of device T1. Thus assuming that a path for the current exists from the drain of T3 to the common terminal, T3 will be conductive. Assuming T3 is conductive, that T3 and T1 have like geometries, T3 will have a conduction current controlled by the Vgs of T1.

The two n-channel devices T4, T2 form a modified second current mirror. The source of T4 is directly connected to the common terminal while the source of T2 is connected via the 1 ohm resistance R1 to the common terminal. Assuming zero external current (I=0), and only 30 μa ambient current, the two source voltages are at essentially the same value. The substrates of both T4 and T2 are connected to ground, which implies negligible difference in body effect (when I=0). The interconnection of the gate of T4 to the gate-drain of T2, then establishes equality between the gate to source voltage of T4 to the gate to ground voltage of T2 (when I=0, Vgs4 approximately equals Vgs2). Since T2 has larger "width" than T4, and is established at the current specified for T1, the Vgs of T2 (when I=0) is less than that required by T4 to conduct this "ambient" current, approximately inverse to the width of the gate. The gate to ground voltage of T2 is applied to T4, and T4 will have a lower conductivity than necessary to sink the ambient current.

The output of the threshold amplifier is high or low dependent on the conductivity of T4; T3 remaining capable of conducting (enabled) at all times. The first serial connection between T1 and T2 in the unbranched first series path forces the current in T2 into equality with the current in T1. The output branch to B1, connected to the second series path, draws no dc current, constraining currents between T3 and T4 to be substantially equal. The voltage at the drain connection, however, seeks an intermediate value proportional to the conductivity of the serially connected devices T3, T4.

Assuming that the goemetries (gate widths and lengths) of T3 and T4 are equivalent, and a momentary condition in which T3 and T4 have equal output voltage drops (Vdd/2), action of the two current mirrors will tend to turn T3 on more strongly than T4 with its lower Vgs. A stable condition will occur, with the device parameters provided, and still assuming I=0, with T4 substantially off, T3 substantially on, and the output drain interconnection high. In practice, T3 is always enabled and the drain interconnection remains high when T4 is of low conductivity, and falls only when the conductivity of T4 exceeds that of T3.

The threshold amplifier is a completely symmetrical structure with the input shorted to ground and with equal geometries. In this case, one would expect the output to be midway between Vdd and ground. In practice the output is near Vdd under this equal condition because of non-symmetry between the second order effects of the n devices and the p devices. The actual threshold for equal geometries is approximately 10 mv.

The amplifier's output is basically the subtraction of two large currents in current sources (high output impedance) with the input providing the unbalancing means. In practice all devices are normally conducting, although it is possible to provide a large enough input to obtain total turn off T4 or T1, T2, T3. Normally the input is held to $-\frac{1}{2}$ to $+1$ volt.

To insure that at zero signal input the output level be near Vdd, the geometry of T2 is made larger than the geometry of T4. This reduces the current in T4.

The buffered output at "01" with T3 more conductive, T4 less conductive, due to buffer inversion, will be low, near zero potential. The output of the threshold amplifier switches when T4 becomes more conductive than T3. As the current I increases in R1, the source of T2 is elevated in respect to ground and the gate-drain voltage will likewise elevate, without substantial modification of the current in the first series path. After I increases past a certain value, the gate to ground potential of T2, to which the Vgs of T4 is made equal, will exceed the Vgs required to begin to turn T4 on more strongly. Thus T4 will become more conductive than T3. When this occurs, the threshold is exceeded, T4's greater conductivity will drive the drain inter-connection from proximity to Vdd toward proximity to ground potential, and the inverting buffer output at "01" will be driven toward the positive Vdd potential.

Figure 3:
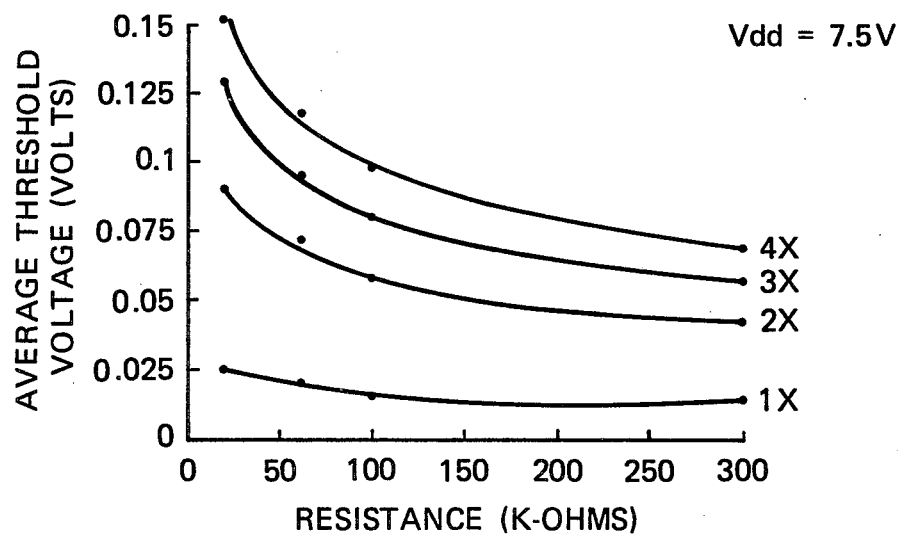

The steepness of the threshold, assuming devices 3 and 4 are of equal geometry and voltage gain, approximates that of T4. The location of the threshold, as illustrated in FIG. 2, is proportional to the Vdd potential, and affected by the value of the series resistance of T5 and the width ratio of T2 to T4. In FIG. 3, it is shown that the threshold voltage may be lowered by reducing the area ratio from 4 to 1, and by increasing the series resistance. The lowest resistance plotted is 20 K and the highest 300 K. While with a unitary area ratio, the threshold voltage is not strongly affected by changing the series resistance, the higher area ratios show a marked reduction in threshold with increasing resistance. FIG. 4 plots the effect on threshold by adjusting the gate width ratios between T4 and T2, holding the series resistance constant and assuming that the geometries of T1, T2 and T3 are alike.

The slope in the threshold region and the value of the threshold is a variable, dependent on the geometry of the four devices. With devices T1, T3, T4 being alike, the gain is a function of $\lambda$, $\lambda$ being a measure of the "channel shortening effect". The $\lambda$ is in turn dependent on the channel length. As the devices becomes longer, the $\lambda$ decreases, and the gain increases. Computer simulations indicate that a slope of 50 may be achieved (at 240 mv) with devices T1, T3 and T4 having 10/10, and T2 having a 30/10 width to length ratios (T5 is 10/30). A slope of 20 may be achieved (at 125 mv) with devices T1, T3, T4 having 20/5 and T2 having 100/5 width to length ratios (T5 is 5/50).

The thresholding action illustrated, can be carried out with the roles of the p-channel devices exchanged with those of the n-channel devices, and the current sensed being in a resistance coupled between the source of a p-channel device and the Vdd Bus.

In addition, the geometry ratios herein suggested may be changed. For instance, in the FIG. 1 embodiment in which devices 1, 3 and 4 are of like geometry, T2 may be a larger area device than the other devices, in which case the threshold is raised above ground potential or a smaller area device in which case the threshold is reduced below ground potential.

In the event that the output characteristic is a slowly changing value and a very positive (i.e., only a high or low value) output state is desired, the output buffer may take the form of a Schmitt trigger, (B1'); which is also known as a hysteresis gate, as illustrated in FIG. 6. The hysteresis gate B1' has a first threshold which is higher to produce a first output as the input of the threshold amplifier rises and a second threshold, which is lower, to produce a second output, as the input of the threshold amplifier decreases. In this practical embodiment, the current sensing resistance is a fraction of an ohm and the current being sensed varies at 120 Hz.

The source of T2 need not be connected to the substrate. This allows the source to be at a different potential from the substrate. If the source is positive with respect to the substrate, the "body effect" will be enhanced changing the actual threshold of the device. The effect is not usually detrimental to circuit operation. Allowing the source to go negative, however, could create problems. The CMOS process inherently creates a bipolar transistor between Vdd and ground (substrate). This deleterious parasitic transistor action is activated when the gate inputs are driven below ground by 0.7 volts, approximately. This therefore limits the dynamic range of the negative input to the threshold amplifier.

The serial resistance exemplified by T5 may be a resistance having a value lying within the range suggested in FIG. 4 or for integrated circuit fabrication, it may be a large geometry FET, (of a long channel) as shown. In either case, the geometry of the devices T1 and T2 should be appropriate to support conduction when the circuit is in operation.

When the threshold amplifier herein disclosed is fabricated in an integrated circuit, the amplifier function requires only a single additional pad at input terminal T1, and no other—if the output is used internally to the chip.

Figure 5:
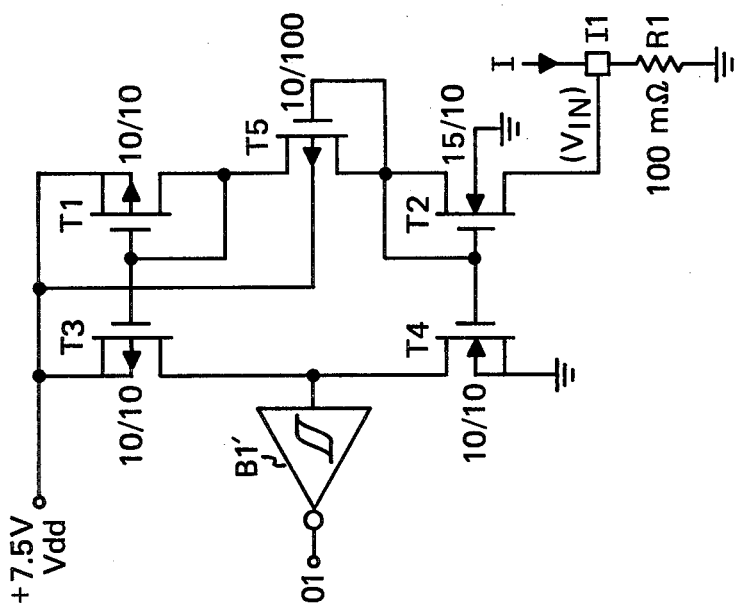

In the FIG. 5 embodiment, the long p-channel FET T5 is shown with the gate connected to the drain for a diode connection. This connection may also be applied to T5 in the FIG. 1 embodiment. This connection tends to make the sensor threshold less dependent on process variations which affect device "$V_{t's}$".

FIGS. 6 and 7 are embodiments in which T11 and T13 are long channel devices of low conductivity for directly setting the currents in the first and second series paths. The ratio of their conductivities may be set by their channel geometries. They may be connected gate to gate to equalize the gate to source voltage, or they may be diode connected. Typically, the device size will be 10/100 for T11 and T13.

What is claimed as new and desired to be secured by Letters Patent of the United States is:

1. A threshold amplifier comprising:
   a. a first and a second terminal for connection to a bias supply,
   b. a first series circuit connected between said first and second supply terminals comprising:
      i. first FET device having the source connected to said first supply terminal,
      ii. a diode connected second FET device having the drain and gate connected together, the interconnection being conductively connected to the drain of said first device,
      iii. a current sensing resistance connected between the source of said second device and said second supply terminal, and
      iv. means to establish a desired current in said first series circuit; and
   c. a second series circuit connected between said first and second supply terminals comprising:
      i. a third, FET device having the source connected to said first supply terminal, and the gate of said third FET device is conductively connected to the gate of said first FET device, and
      ii. a fourth FET device having the drain thereof connected to the drain of said third device, the source of said fourth device being connected to said second supply terminal, said first and third devices being of the same polarity type, and second and fourth devices being of the same polarity type, and complementary to said first and third devices, d. said first and third devices having fixed conductivity ratio in each series path, e. means connecting the gate of said fourth device to the gate-drain connection of said second device to equalize the gate to source voltage of said fourth device to the voltage between the gate of said second device and said second supply terminal, f. an input terminal for coupling a current to be sensed into said current sensing resistance, the voltage drop attributable thereto displacing the voltage of the source of said second device in relation to the voltage at said second supply terminal, and in turn the gate to source voltage of said fourth device, said fourth device being in a low conduction state in the absence of sensed current and in a high conduction state when said sensed current exceeds a given value, said third device being capable of conduction throughout, and g. output means coupled to the drain connection of said third and fourth devices to provide a first digital output level when the sensed current is below said given value and a second digital output level, when the sensed current is above said given value.

2. The threshold amplifier as set forth in claim 1 wherein:
  a. said first and second supply terminals are respectively the positive terminal and negative terminal of said supply; and
  b. said first and third FET devices are p-channel devices, and said second and fourth FET devices are n-channel devices.

3. The threshold amplifier as set forth in claim 1 wherein:
  a. said first and second supply terminals are respectively the negative terminal and positive terminal of said supply; and
  b. said first and third FET devices are n-channel devices, and said second and fourth FET devices are p-channel devices.

4. The threshold amplifier as set forth in claim 1 wherein:
  a. said first FET device is diode connected, having the gate and drain connected together,
  b. said means to establish a current in said first series circuit is a fifth FET device, conductively connecting the gate-drain of said first device to the gate-drain of said second device, said fifth device being of low conductivity relative to said first and second devices, and
  c. the gates of said first and third devices being connected together to equalize the gate to source voltages and set said conductivity ratio.

5. The threshold amplifier as set forth in claim 4 wherein:
the width of the gate region of said second device differs from that of said fourth device to adjust the diode voltage drop therein in relation to the diode voltage drop of said first device, and in turn to displace the value of sensed current at which said third device beings to conduct.

6. The threshold amplifier as set forth in claim 5 wherein:

a. said first and second supply terminals are respectively the positive terminal and negative terminals of said supply; and
b. said first and third FET devices are p-channel devices, and said second and fourth FET devices are n-channel devices,
c. the substrates of said first and third devices are connected to said positive terminal, and the substrates of said second and fourth devices are connected to said negative terminal.

7. The threshold amplifier as set forth in claim 6 wherein:
said output means includes an inverting C-MOS buffer amplifier.

8. The threshold amplifier as set forth in claim 6 wherein:
said output means includes an inverting buffer amplifier with hysteresis.

9. The threshold amplifier as set forth in claim 4 wherein:
said fifth FET device is diode connected, having the gate thereof connected to the drain thereof.

10. A threshold amplifier as set forth in claim 1 wherein:
said first FET device is of low conductivity providing said means for establishing a desired current in said first series circuit and wherein
said third FET device is of low conductivity, the geometries of said first and third FETs providing said fixed conductivity ratio.

11. A threshold amplifier as set forth in claim 10 wherein
said first and third devices have their gates connected together to equalize the gate to source voltages and set said conductivity ratio.

12. A threshold amplifier comprising:
a. a first and second terminal for connection to a bias supply, and
b. a first series circuit connected between said first and second supply terminals comprising:
  i. first FET device having the source connected to said first supply terminal, and having the drain and gate connected together, said first FET device providing means for establishing a desired current in said first series circuit,
  ii. a diode-connected second FET device having the drain and gate connected together, the interconnection being conductively connected to the drain of said first device,
  iii. a current sensing resistance connected between the source of said second device and said second supply terminal, and
c. a second series circuit connected between said first and second supply terminals comprising:
  i. a third FET device having the source connected to said first supply terminal, and having the drain and gate connected together, and
  ii. a fourth FET device having the drain thereof connected to the drain of said third device, the source of said fourth device being connected to said second supply terminal, said first and third devices being of the same polarity type, and second and fourth devices being of the same polarity type, and complementary to said first and third devices,
d. said first and third devices having fixed conductivity ratio in each series path, e. means connecting the gate of said fourth device to the gate-drain connection of said second device to equalize the gate to source voltage of said fourth device to the voltage between the gate of said second device and said second supply terminal, f. an input terminal for coupling a current to be sensed into said current sensing resistance, the voltage drop attributable thereto displacing the voltage of the source of said second device in relation to the voltage at said second supply terminal, and in turn the the gate to source voltage of said fourth device, said fourth device being in a low conduction state in the absence of sensed current and in a high conduction state when said sensed current exceeds a given value, said third device being capable of conduction throughout, and g. output means coupled to the drain connection of said third and fourth devices to provide a first digital output level when the sensed current is below said given value and a second digital output level, when the sensed current is above said given value.

13. The threshold amplifier as set forth in claim 12
   a. said first and second supply terminals are respectively the positive terminal and negative terminal of said supply; and
   b. said first and third FET devices are P-channel devices, and said second and fourth FET devices are N-channel devices.

14. The threshold amplifier as set forth in claim 12 wherein:
   a said first and second supply terminals are respectively the negative terminal and positive terminal of said supply; and
   b. said first and third FET devices are n-channel devices and said second and fourth FET devices are p-channel devices.

* * * * *